US008589654B2

(12) United States Patent
Takai (10) Patent No.: US 8,589,654 B2
(45) Date of Patent: Nov. 19, 2013

(54) MEMORY DEVICE, MEMORY SYSTEM, AND ACCESS TIMING ADJUSTING METHOD IN MEMORY SYSTEM

(75) Inventor: Yuji Takai, Osaka (JP)

(73) Assignee: Panasonic Corporation, Osaka (JP)

( * ) Notice: Subject to any disclaimer, the term of this patent is extended or adjusted under 35 U.S.C. 154(b) by 1045 days.

(21) Appl. No.: 12/596,265

(22) PCT Filed: Aug. 25, 2008

(86) PCT No.: PCT/JP2008/002296
§ 371 (c)(1),
(2), (4) Date: Oct. 16, 2009

(87) PCT Pub. No.: WO2009/110040
PCT Pub. Date: Sep. 11, 2009

(65) Prior Publication Data
US 2010/0146237 A1    Jun. 10, 2010

(30) Foreign Application Priority Data
Mar. 7, 2008    (JP) ................................. 2008-057876

(51) Int. Cl.
*G06F 12/00* (2006.01)
(52) U.S. Cl.
USPC .......................................... 711/167; 711/105
(58) Field of Classification Search
None
See application file for complete search history.

(56) References Cited

U.S. PATENT DOCUMENTS

| 6,115,318 A | 9/2000 | Keeth |
| 6,911,851 B2 | 6/2005 | Sekiguchi et al. |
| 7,218,569 B2 * | 5/2007 | Richter .................... 365/230.03 |
| 2002/0040424 A1 | 4/2002 | Kumazawa |
| 2005/0135167 A1 | 6/2005 | Manabe |
| 2007/0171759 A1 * | 7/2007 | Cheon ...................... 365/230.08 |
| 2008/0048747 A1 | 2/2008 | Iizuka |

FOREIGN PATENT DOCUMENTS

| JP | 05-020179 A | 1/1993 |
| JP | 2002-108693 A | 4/2002 |
| JP | 2005-141725 A | 6/2005 |
| JP | 2006-099244 A | 4/2006 |
| JP | 2006-099245 A | 4/2006 |
| JP | 2007-249738 A | 9/2007 |
| JP | 2008-052335 A | 3/2008 |

OTHER PUBLICATIONS

How to Use DDR SDRAM—User's Manual (Document No. E0234E50 (Ver. 5.0)) Elpida Memory, Inc., Aug. 2007.
DDR3 SDRAM Specification JESD79-3A Sep. 2007 (Revisions of JESD79-3).

* cited by examiner

*Primary Examiner* — Gary Portka
(74) *Attorney, Agent, or Firm* — McDermott Will & Emery LLP (57) ABSTRACT

A memory device (103) includes a memory device controller (140), a delay adjustment storage unit (170) configured to store timing adjustment data which is read as both values 0 and 1 at a rise and a fall of a strobe signal, a memory cell (174), and a selector (172) configured to switch connection to the delay adjustment storage unit or the memory cell. A memory interface (102) reads the timing adjustment data of the delay adjustment storage unit (170) while changing the timing to search for a read timing range, and selects and sets read timing from the timing range.

38 Claims, 8 Drawing Sheets

MEMORY DEVICE, MEMORY SYSTEM, AND ACCESS TIMING ADJUSTING METHOD IN MEMORY SYSTEM

This application is the U.S. National Phase under 35 U.S.C. §371 of International Application No. PCT/JP 2008/002296, filed on Aug. 25, 2008, which in turn claims the benefit of Japanese Application No. 2008-057876, filed on Mar. 7, 2008, the disclosures of which Applications are incorporated by reference herein.

TECHNICAL FIELD

The present invention relates to a memory device capable of quickly, reliably and accurately adjusting access timing, a memory system employing the memory device, and a method for adjusting access timing in the memory system.

BACKGROUND ART

In many conventional memory systems, a memory device such as synchronous DRAM (SDRAM) which is capable of inputting and outputting data in synchronization with an externally input high-speed clock has been used as processing speed has been increased. In particular, Double-Data-Rate (DDR) SDRAM can input and output data at both a rising edge and a falling edge of a clock, whereby the speed of input and output of data can be increased (see, for example, Non-Patent Document 1).

In a memory system employing a DDR SDRAM, data (DQ) is input and output in synchronization with both a rising edge and a falling edge of a data strobe (DQS) signal. However, the valid period of data decreases with an increase in the speed of clock frequency. For example, the valid period of data is 3 ns at 166 MHz. The valid period further decreases if the clock frequency is further increased. Moreover, the relationship between data and the strobe signal varies depending on various factors, such as a process characteristic, a change in temperature, a change in voltage and the like, and therefore, it is difficult to stably input and output data.

Therefore, a calibration process of adjusting access timing is performed so as to stably input and output data (see, for example, Patent Documents 1 and 2).

The calibration process includes two processes: a read calibration process involved in reading of data from a DDR SDRAM; and a write calibration process involved in writing of data to the DDR SDRAM.

The read calibration process includes:
a data write process of setting data in the DDR SDRAM;
a read timing range search process of obtaining a timing range within which read can be performed in a manner which allows read data to match written data, by changing a delay relationship between read data and a read strobe signal; and
an optimum read timing setting process of selecting and setting optimum timing from the read timing range (e.g., a center of a delay range within which read can be performed is selected).

The write calibration process includes:
an optimum read timing setting process of setting optimum read timing selected in the read calibration process;
a write timing range search process of obtaining a timing range within which write can be performed in a manner which allows written data to match read data when data is written into and then read out from the DDR SRAM, by changing a delay relationship between write data and a write strobe signal; and
an optimum write timing setting process of selecting and setting optimum write timing from the write timing range (e.g., a center of a delay range within which write can be performed is selected).

Thus, in order to read data from the DDR SDRAM with optimum timing, a read timing range is searched to select and set optimum read timing. In addition, in order to write data into the DDR SDRAM, a write timing range is searched to select and set optimum write timing.

The timing of data and a strobe signal can be typically changed by supplying information about a delay setting to a variable delay device with respect to a clock, the data and the strobe signal.

In the aforementioned conventional technique, the read calibration process is based on the assumption that timing with which data can be written is previously set into a memory cell of a memory device via data signal lines which are operated with a high-speed clock. In addition, in the DDR SDRAM, data is changed at half clock periods (half cycles) of the high-speed clock, and therefore, a period of time during which data is settled is short, and the timing of data and a strobe signal or the like needs to be set with precision and accuracy.

Recent DDR3-SDRAM has a read-only MPR (multi-purpose register) in which data (01010101) is previously set (see, for example, Non-Patent Document 2). By switching a data access path from a memory cell to the MPR using a selector, read calibration can be performed using the MPR in which data is previously set. However, as the previously set data is 01010101, data 0 and data 1 are read at a rise and a fall of a strobe signal, respectively. Therefore, calibration cannot be carried out with respect to both data 0 and data 1 at a rise and a fall of a strobe signal, and therefore, timing cannot be adjusted with accuracy, which is a problem.

Note that the present invention has storage means in a memory device and includes a process of setting data into the storage means within the memory device. A conventional example of this process is described in, for example, Patent Document 3. However, the subject matter of Patent Document 3 is directed to a technique of increasing the speed of setting of data into the storage means, and therefore, is not the calibration process technique pertaining to the present invention.

CITATION LIST

PATENT DOCUMENT 1: Japanese Laid-Open Patent Publication No. 2005-141725
PATENT DOCUMENT 2: Japanese Laid-Open Patent Publication No. 2007-249738
PATENT DOCUMENT 3: Japanese Laid-Open Patent Publication No. H05-20179
NON-PATENT DOCUMENT 1: HOW TO USE DDR SDRAM—User's Manual (Document No. E0234E50 (Ver. 5.0)) Elpida Memory, Inc., August 2007
NON-PATENT DOCUMENT 2: DDR3 SDRAM Specification JESD79-3A September 2007 (Revision of JESD79-3)

SUMMARY OF THE INVENTION

Technical Problem

However, the conventional calibration process has the following problem. Specifically, the read calibration process is based on the assumption that data can be written into the DDR SDRAM from the data signal lines which are operated with a high-speed clock. To achieve this, write timing with which data can be written into the DDR SDRAM needs to be previously theoretically estimated.

Also, when write timing cannot be estimated or when write cannot be performed to realize the result of estimation, the calibration process is a considerably difficult or time-consuming process. For example, if timing adjustment needs to be performed using a variable delay device with respect to n stages for write and m stages for read, where n and m are integers, expected value comparison for write and read needs to be performed a maximum of (n×m) times, so that a huge processing time is required.

When the MPR of a DDR3-SDRAM is used, the previously set data 01010101 does not allow read calibration to be carried out with respect to both data 0 and data 1 at a rise and a fall of a strobe signal, and therefore, read timing cannot be adjusted with accuracy.

An object of the present invention is to provide a memory device capable of quickly, reliably and accurately setting optimum access timing with respect to a memory device, a memory system employing the memory device, and a method for adjusting access timing in the memory system.

Solution to the Problem

To achieve the object, the present invention provides a memory system including a memory device and a memory interface configured to access the memory device. The memory device includes a memory device controller, a delay adjustment storage unit configured to store timing adjustment data which is read as both values 0 and 1 at a rise and a fall of a strobe signal, a memory cell, and a selector configured to switch connection to the delay adjustment storage unit or the memory cell. The memory interface reads the timing adjustment data of the delay adjustment storage unit while changing the timing to search for a read timing range, and selects and sets read timing from the timing range.

Thus, in the memory device, the timing adjustment data which is well-defined information which is read as both values 0 and 1 at a rise and a fall of a strobe signal can be stored in the delay adjustment storage unit, and the memory interface can read out the timing adjustment data stored in the delay adjustment storage unit of the memory device while changing the read timing to search for a read timing range, and reliably, quickly and accurately set optimum timing from the timing range.

Moreover, in one embodiment, the timing adjustment data can be set using a command signal which varies in units of one clock period (one cycle) of a high-speed clock, and therefore, timing can be adjusted with accuracy using various pieces of data. Here, the use of the command signal can make it easier to set data than when data signal lines are used.

Moreover, in another embodiment, the delay adjustment storage unit is provided in the memory cell. As a result, the delay adjustment storage unit does not need to be separately prepared, whereby an increase in the area of the memory device can be prevented.

ADVANTAGES OF THE INVENTION

According to the present invention, it is possible to achieve a memory device capable of quickly, reliably and accurately adjusting timing of access to the memory device, and a memory system employing the memory device, and a method for adjusting access timing in the memory system.

DESCRIPTION OF EMBODIMENTS

Hereinafter, embodiments of the present invention will be described with reference to the accompanying drawings.

(First Embodiment)

Figure 1:
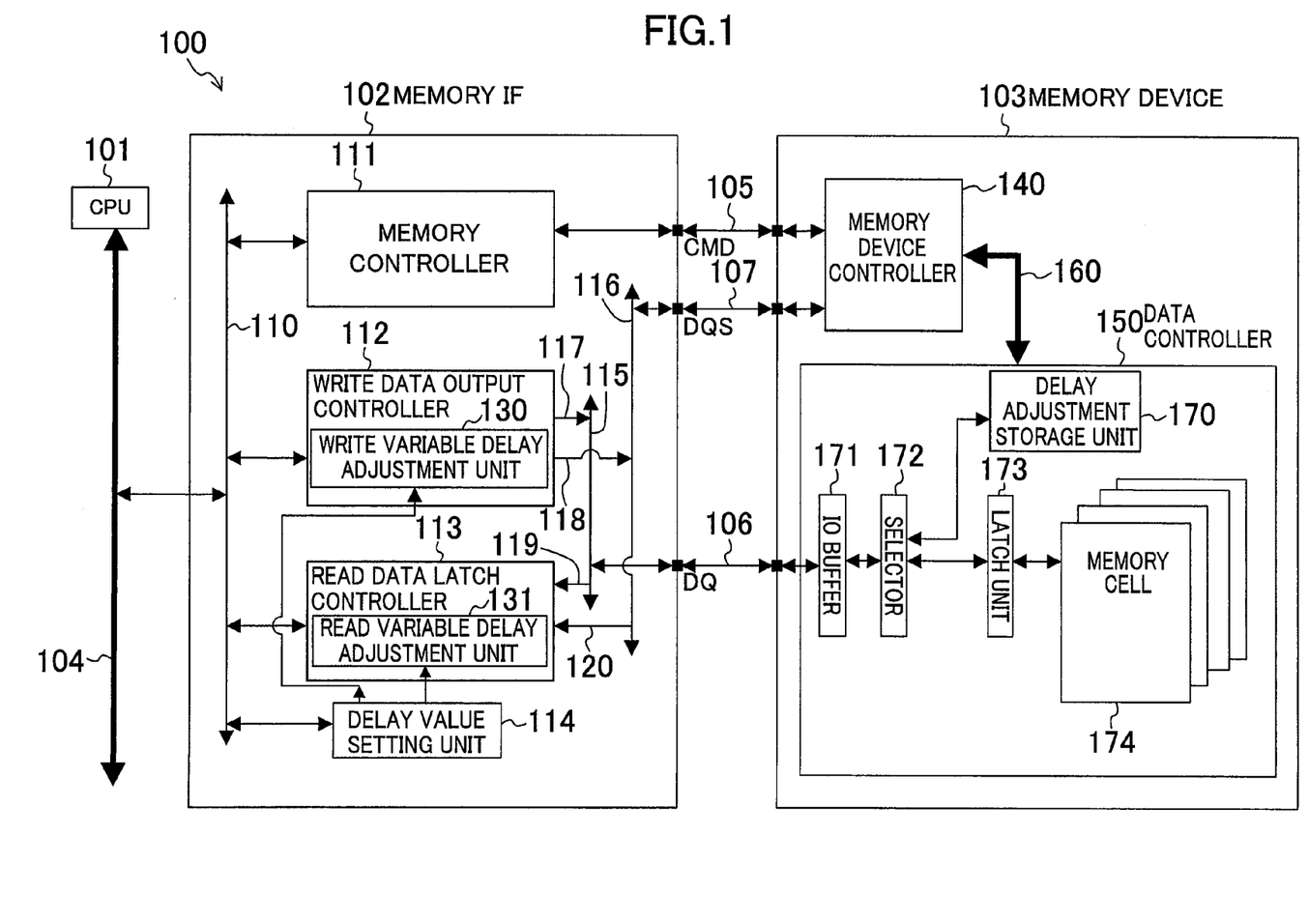
FIG. 1 is a block diagram showing an example configuration of a memory system according to the present invention.

FIG. 1 shows a configuration of a memory system according to a first embodiment of the present invention. The memory system 100 of FIG. 1 includes a CPU 101, a memory interface (memory IF) 102, and a memory device 103.

The CPU 101 and the memory IF 102 exchange command information for setting and controlling the memory IF 102 and command information for setting and controlling the memory device 103 via a system bus 104. Also, the system bus 104 is used to transfer command information for reading data from the memory device 103, command information for writing data into the memory device 103, and data information.

The memory IF 102 and the memory device 103 are connected to each other via command (CMD) signal lines 105, data (DQ) signal lines 106, and a strobe (DQS) signal line 107.

The command signal lines 105 are used to transfer command information for setting and controlling the memory device 103, reading data from the memory device 103, writing data into the memory device 103, refreshing the memory device 103, reducing power to the memory device 103, or the like, between the memory IF 102 and the memory device 103.

The data signal lines 106 are used to transfer write data information which is to be written from the memory IF 102 into the memory device 103, and read data information which has been read out from the memory device 103. The data signal lines 106 are typically bidirectional signal lines.

The strobe signal line 107 is used to output a write strobe signal from the memory IF 102 to the memory device 103 when write data information is to be written from the memory IF 102 into the memory device 103. Conversely, the strobe signal line 107 is used to output a read strobe signal from the memory device 103 to the memory IF 102 when read data information is to be read out from the memory device 103. The strobe signal line 107 is typically a bidirectional signal line.

Next, a configuration of the memory IF 102 will be described. The memory IF 102 includes a memory IF bus 110, a memory controller 111, a write data output controller 112, a read data latch controller 113, a delay value setting unit 114, a data input/output controller 115, and a strobe input/output controller 116.

The memory IF bus 110 is connected to the system bus 104, the memory controller 111, the write data output controller 112, the read data latch controller 113, and the delay value setting unit 114. The memory IF bus 110 is used to transfer command information and data information to and from the system bus 104. The memory IF bus 110 is also used to transfer command information for setting and control and data information between each of the memory controller 111, the write data output controller 112, the read data latch controller 113, and the delay value setting unit 114 in the memory IF 102.

The memory controller 111 transfers command information using the command signal lines 105 so as to control the memory device 103. The memory controller 111 also controls the write data output controller 112, the read data latch controller 113, and the delay value setting unit 114 using the memory IF bus 110.

The write data output controller 112 has a write variable delay adjustment unit 130. The write data output controller 112 outputs write data information and a write strobe signal through write data signal lines 117 and a write strobe signal line 118, respectively, to the memory device 103.

The write variable delay adjustment unit 130 adjusts timing of the write data information and the write strobe signal. The write variable delay adjustment unit 130 includes a delay line whose delay value can be programmably changed. The delay line can be used to adjust the timing.

The read data latch controller 113 has a read variable delay adjustment unit 131. The read data latch controller 113 reads read data information and a read strobe signal through read data signal lines 119 and a read strobe signal line 120, respectively, from the memory device 103.

The read variable delay adjustment unit 131 adjusts timing of the read data information and the read strobe signal. The read variable delay adjustment unit 131 includes a delay line whose delay value can be programmably changed. The delay line can be used to adjust the timing.

The delay value setting unit 114 controls the write variable delay adjustment unit 130 and the read variable delay adjustment unit 131 based on command information and data information from the memory IF bus 110. Specifically, timing adjustment for reading data information from the memory device 103 is performed by setting read delay information into the delay value setting unit 114 to determine a delay value of the read variable delay adjustment unit 131 and thereby determining the timing of the read data information and the read strobe signal. Likewise, timing adjustment for writing data information into the memory device 103 is performed by setting write delay information into the delay value setting unit 114 to determine a delay value of the write variable delay adjustment unit 130 and thereby determining the timing of the write data information and the write strobe signal.

The data input/output controller 115 connects the write data signal lines 117 and the read data signal lines 119 with the data signal lines 106 to control input/output of data information. The strobe input/output controller 116 connects the write strobe signal line 118 and the read strobe signal line 120 with the strobe signal line 107 to control input/output of a strobe signal.

The memory device 103 includes a memory device controller 140, a data controller 150, and a memory device bus 160.

The memory device bus 160 connects the memory device controller 140 with the data controller 150 to transfer command information for setting and control between the memory device controller 140 and the data controller 150.

The memory device controller 140 connects to the command signal lines 105, the strobe signal line 107, and the memory device bus 160. The memory device controller 140 receives command information from the memory IF 102 via the command signal lines 105 to control the memory device 103.

The data controller 150 connects to the memory device bus 160 and the data signal lines 106, and transfers data information to the memory IF 102 using the data signal lines 106 under control of the memory device controller 140. The data controller 150 includes a delay adjustment storage unit 170, an IO buffer 171, a selector 172, a latch unit 173, and a memory cell 174.

The delay adjustment storage unit 170 stores timing adjustment data which is used to adjust the timing of the read data information and the read strobe signal input to the read data latch controller 113 so as to read the read data information from the memory device 103 into the memory IF 102.

The IO buffer 171 is located between the data signal lines 106 and the selector 172, and connects to the memory IF 102 via the data signal lines 106, and to the selector 172.

The IO buffer 171 controls input/output of data information from/to the memory IF 102, and adjusts timing of data input/output.

The selector 172 connects to the IO buffer 171, the delay adjustment storage unit 170, and the latch unit 173. The selector 172 selects one of the delay adjustment storage unit 170 and the latch unit 173.

The latch unit 173 writes data information into the memory cell 174 or reads data information from the memory cell 174.

The memory cell 174 stores data information. In the case of DDR SDRAM, a plurality of DRAM cells are used to form a plurality of bank structures.

Note that the order of the selector 172 and the latch unit 173 may be reversed. Also, although the memory device 103 has been assumed to be a DDR SDRAM as an example, the memory device 103 may be other memory devices.

Figure 2:
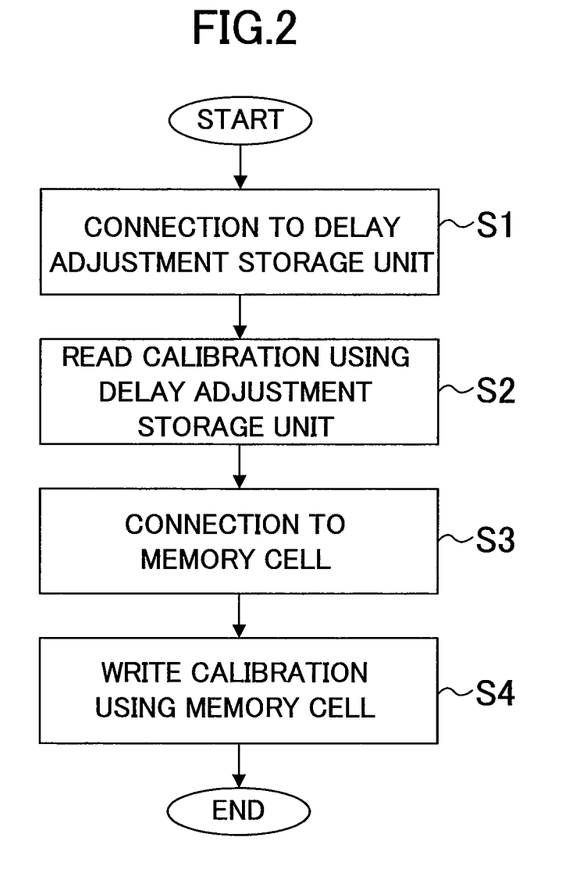
FIG. 2 is a flow diagram showing operation of the example configuration of FIG. 1.

Operation of searching for a timing range within which data can be read and written and setting optimum timing in the memory system 100 of the first embodiment of the present invention will be described with reference to FIG. 2.

Step S1 is a "connection to delay adjustment storage unit" step of issuing, from the memory IF 102 to the memory device 103, command information for setting the connection target of the selector 172 to the delay adjustment storage unit 170.

Step S2 is a "read calibration using delay adjustment storage unit" step of repeatedly performing operation of changing a delay value from the delay value setting unit 114 to the read variable delay adjustment unit 131, causing the read data latch controller 113 to read out data information from the delay adjustment storage unit 170 in the memory device 103, and comparing expected values, to search for a delay value within a range in which data information can be correctly read out, and set an appropriate read delay value from the read delay value range within which data information can be read out, to the delay value setting unit 114. An optimum read delay value can be determined by, for example, selecting a center value of the read delay value range within which data information can be read out from the memory device 103.

Step S3 is a "connection to memory cell" step of issuing command information from the memory IF 102 to the memory device 103, the command information being used to set the connection target of the selector 172 to the latch unit 173, i.e., set the connection path of the selector 172 to the memory cell 174.

Step S4 is a "write calibration using memory cell" step of repeatedly performing operation of changing a delay value from the delay value setting unit 114 to the write variable delay adjustment unit 130, writing data information from the write data output controller 112 into the memory cell 174 of the memory device 103, and reading out the written data information from the read data latch controller 113, to search for a write delay value range within which the written data matches the read data, and set an optimum write delay value within the delay value range within which the written data matches the read data, into the delay value setting unit 114.

The optimum write delay value can be determined by, for example, selecting a center value of a write delay value range within which data information can be written into the memory device 103.

Although it has been assumed above that the timing of data information and a strobe signal from the write data output controller 112 and the read data latch controller 113 is adjusted by setting and control of the CPU 101, a timing adjustment sequencer unit which performs timing adjustment using an activation signal or command information may be provided in the memory IF 102.

(Second Embodiment)

Figure 3:
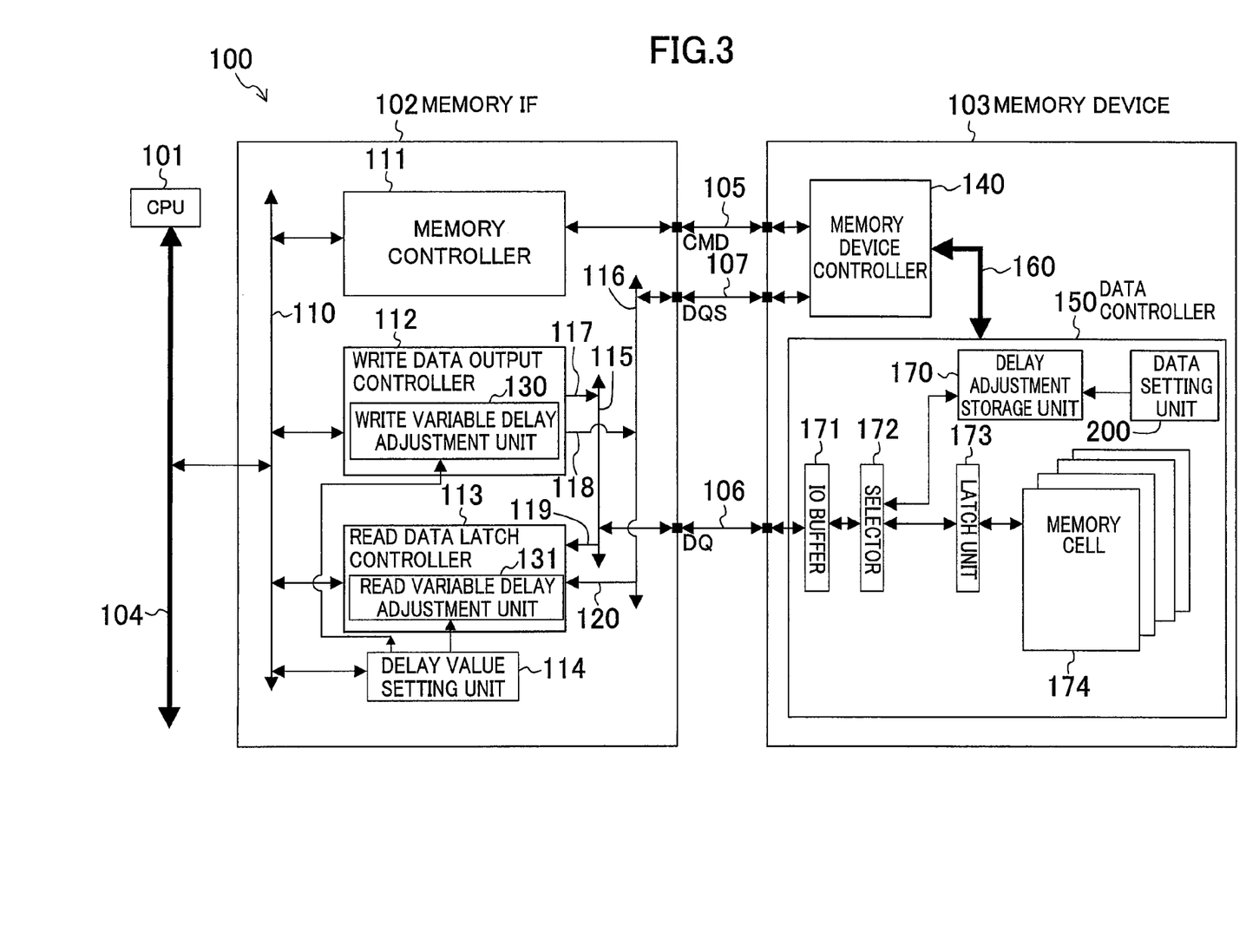
FIG. 3 is a block diagram showing a second example configuration of the memory system of the present invention.

FIG. 3 shows a memory system according to a second embodiment of the present invention. The components of FIG. 3 are the same as those of FIG. 1, except that a data setting unit 200 and a connection signal line between the data setting unit 200 and the delay adjustment storage unit 170 are added.

The delay adjustment storage unit 170 further has a function of storing timing adjustment data which is used to adjust timing of write data information and a write strobe signal, so as to write the write data information from the memory IF 102 into the memory device 103.

The data setting unit 200 sets timing adjustment data into the delay adjustment storage unit 170. The timing adjustment data which is set in the delay adjustment storage unit 170 by the data setting unit 200 is data which is previously stored into the data setting unit 200 in accordance with command information or a specific signal from the memory IF 102.

Although data previously stored in the data setting unit 200 is used, data which is previously stored in a portion other than the data setting unit 200 of the memory device 103 may be used. Alternatively, the timing adjustment data may be transferred as command information from the memory IF 102 via the command signal lines 105, and may be set via the memory device controller 140 and the memory device bus 160 into the delay adjustment storage unit 170 by the data setting unit 200.

Also, although the data setting unit 200 is provided in the data controller 150, the data setting unit 200 may be provided in the memory device controller 140. In this case, the timing adjustment data is set into the delay adjustment storage unit 170 via the memory device bus 160.

Figure 4:
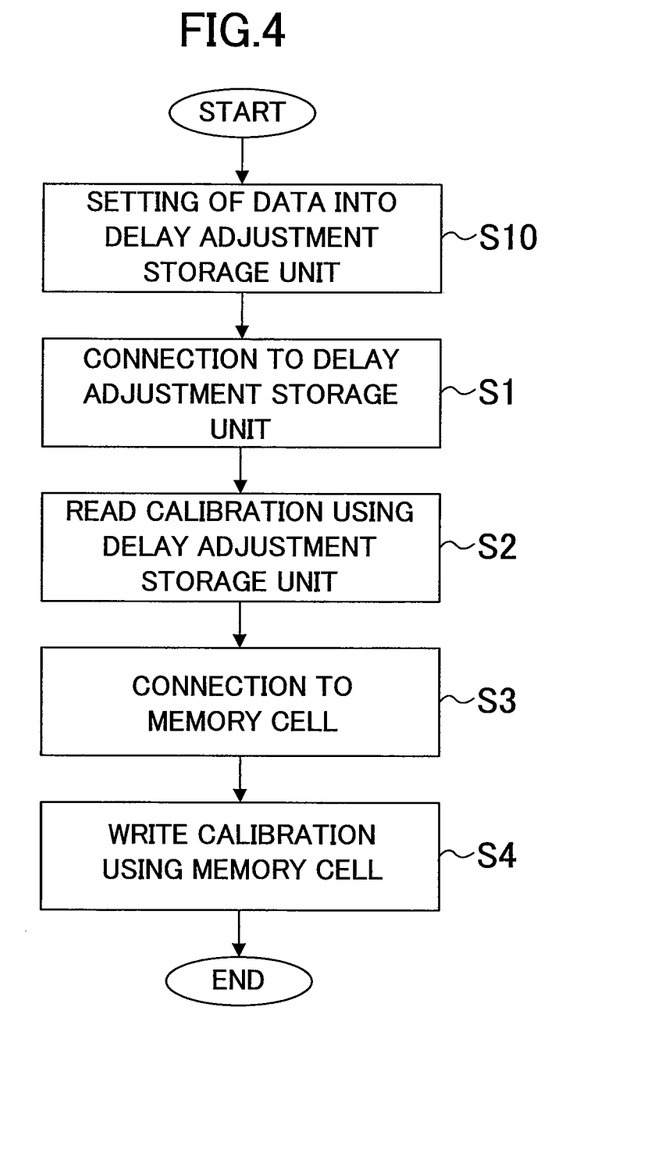
FIG. 4 is a flow diagram showing operation of the example configuration of FIG. 3.

Operation of searching for a delay range within which data can be read and written and setting an optimum delay value in the memory system 100 of the second embodiment of the present invention will be described with reference to FIG. 4. The operation of FIG. 4 is the same as that of FIG. 2, except that step S10 is added at the beginning of the operation and the process flows from S10 to S1 to S2 to S3 to S4. Steps S1, S2, S3 and S4 are the same processes as those shown in FIG. 2.

Step S10 is a "setting of data into delay adjustment storage unit" step of causing the data setting unit 200 to set timing adjustment data into the delay adjustment storage unit 170. The timing adjustment data which is set into the delay adjustment storage unit 170 may be data which is previously stored in the data setting unit 200. Alternatively, the timing adjustment data may be one which is transferred from the memory IF 102 via the command signal lines 105. The timing adjustment data is set in accordance with command information from the memory IF 102. Note that the order of S10 and S1 may be reversed.

Another operation in the memory system 100 of the second embodiment of the present invention will be described with reference to FIG. 5. The process of FIG. 5 flows from S10 to S1 to S2 to S20. Steps S10, S1 and S2 are the same as those shown in FIGS. 2 and 4.

Figure 5:
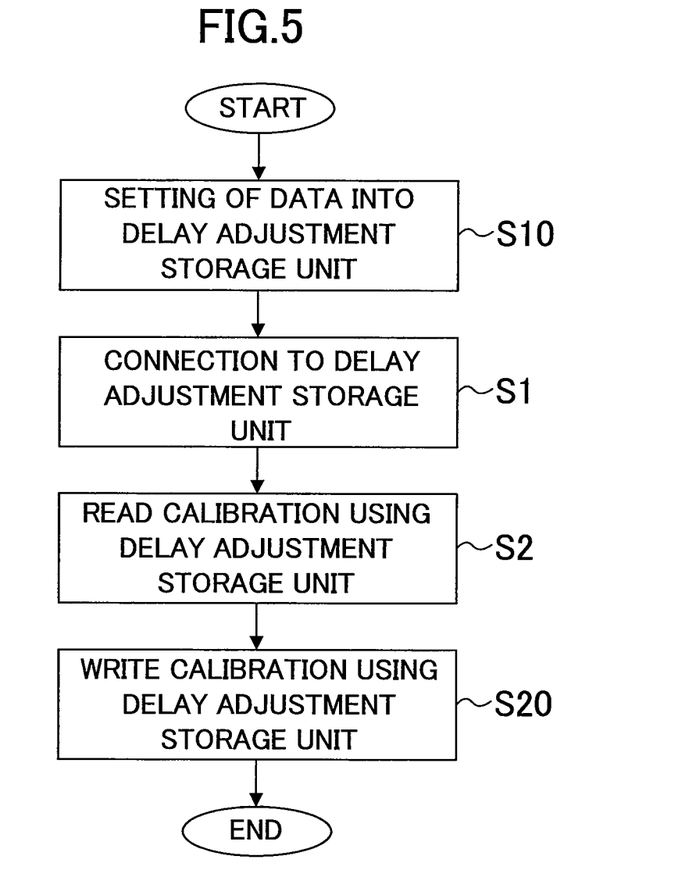
FIG. 5 is a flow diagram showing other operation of the example configuration of FIG. 3.

In FIG. 5, the write calibration process using the memory cell 174 in S3 and S4 is replaced with a "write calibration using delay adjustment storage unit" step (S20) of performing write calibration using the delay adjustment storage unit 170. Note that the order of S10 and S1 may be reversed.

(Third Embodiment)

Figure 6:
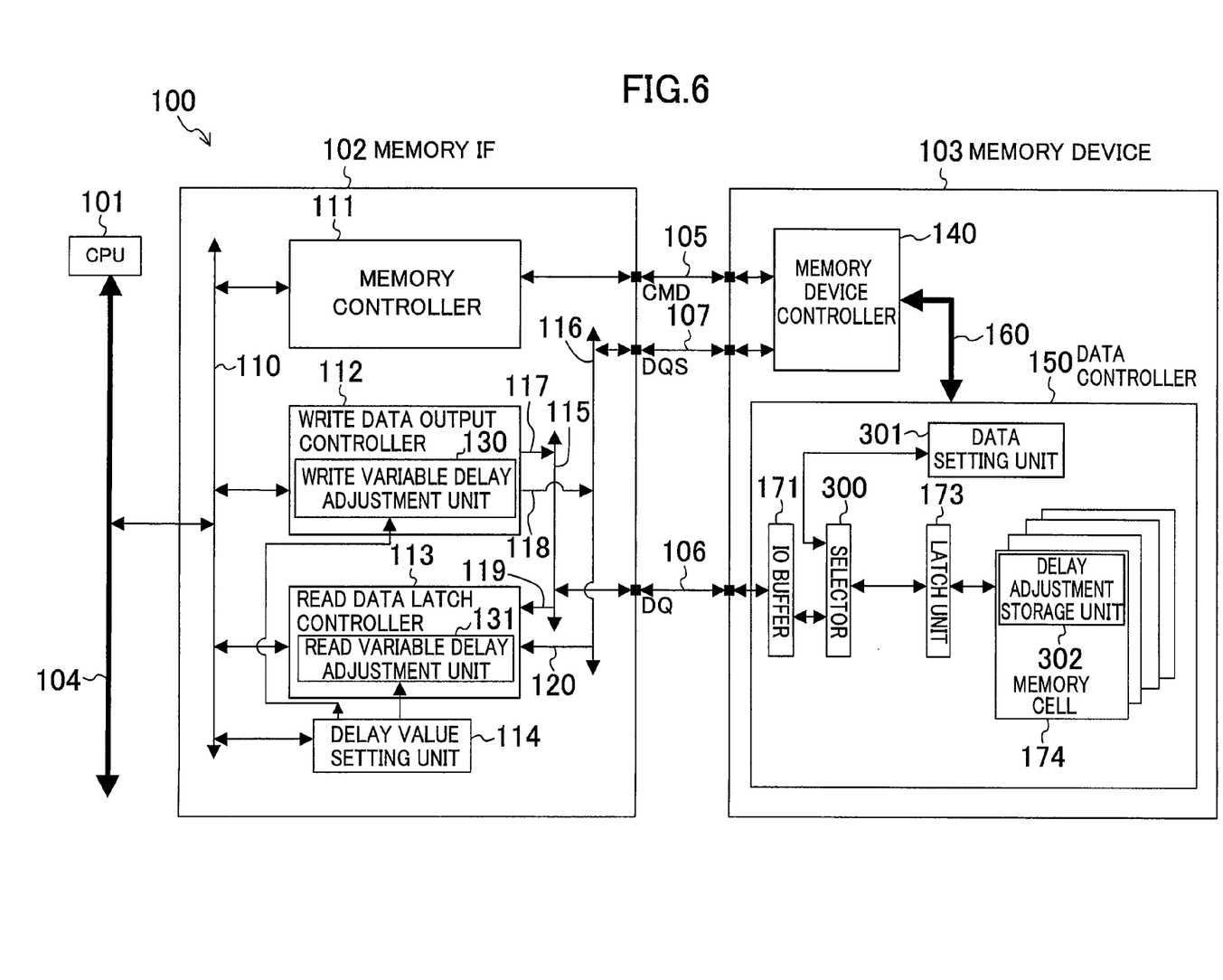
FIG. 6 is a block diagram showing a third example configuration of the memory system of the present invention.

FIG. 6 shows a memory system according to a third embodiment of the present invention. The memory system 100 of FIG. 6 has a delay adjustment storage unit 302 as a portion of the memory cell 174. The components of FIG. 6 are the same as those of FIG. 3, except that a data setting unit 301 is added, and access from the IO buffer 171 and the data setting unit 301 to the memory cell 174 can be selected by a selector 300.

The data setting unit 301 sets timing adjustment data via the selector 300 and the latch unit 173 into the delay adjustment storage unit 302 which is set as a portion of the memory cell 174.

Note that the timing adjustment data which is set from the data setting unit 301 into the delay adjustment storage unit 302 which is set as a portion of the memory cell 174, may be data which is previously stored in the data setting unit 301. Alternatively, the timing adjustment data may be data which is previously stored in a portion other than the data setting unit 301 of the memory device 103. Alternatively, the timing adjustment data may be transferred as command information from the memory IF 102 via the command signal lines 105, the memory device controller 140, the memory device bus 160, the data setting unit 301, the selector 300 and the latch unit 173, into the delay adjustment storage unit 302 which is set as a portion of the memory cell 174.

Although the data setting unit 301 is provided in the data controller 150, the data setting unit 301 may be provided in the memory device controller 140. In this case, the timing adjustment data is set into the delay adjustment storage unit 302 via the memory device bus 160.

Figure 7:
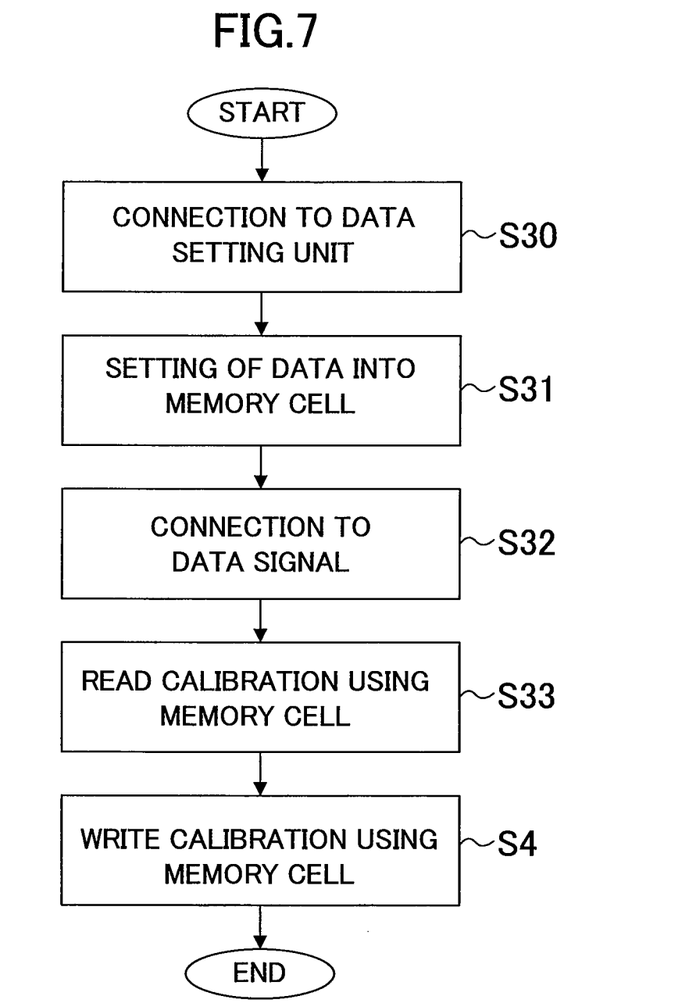
FIG. 7 is a flow diagram showing operation of the example configuration of FIG. 6.

Operation of searching for a delay range within which data can be read and written and setting an optimum delay value in the memory system 100 of the third embodiment of the present invention will be described with reference to FIG. 7. In FIG. 7, the process flows from S30 to S31 to S32 to S33 to S4. Step S4 is the same as that shown in FIG. 4.

Step S30 is a "connection to data setting unit" step of issuing, from the memory IF 102 to the memory device 103, command information for setting the connection target of the selector 300 to the data setting unit 301.

Step S31 is a "setting of data into memory cell" step of setting timing adjustment data from the data setting unit 301 into the delay adjustment storage unit 302 which is set as a portion of the memory cell 174, in accordance with a command from the memory IF 102.

Step S32 is a "connection to data signal" step of issuing, from the memory IF 102 to the memory device 103, command information which is used to set the connection target of the selector 300 to the IO buffer 171, to connect the latch unit 173 connecting to the memory cell 174, with the IO buffer 171 connecting to the data signal lines 106.

Step S33 is a "read calibration using memory cell" step of repeatedly performing operation of changing a delay value from the delay value setting unit 114 to the read variable delay adjustment unit 131, causing the read data latch controller 113 to read out data information from the delay adjustment storage unit 302 which is set as a portion of the memory cell 174 of the memory device 103, and comparing expected values, to search for a delay value range within which data information can be correctly read out, and set an appropriate read delay value from the read delay value range into the delay value setting unit 114. The optimum read delay value can be determined by, for example, selecting a center value of the range within which data information can be correctly read out from the memory device 103.

Finally, an example of the timing adjustment data to be set into the delay adjustment storage units 170 and 302 of the first, second and third embodiments of the present invention will be described with reference to FIG. 8.

In the case of DDR SDRAM, as data information is written and read at both rising and falling edges of a strobe signal, it is necessary to check four combinations of data 0 or 1 of a rise of the strobe signal and data 0 or 1 at a fall of the strobe signal. Specifically, for the output of data information from the memory IF 102 to the memory device 103, it is necessary to check four combinations of the rise or fall of a clock and data 0 or 1, and also for the reading of data from the memory device 103 into the memory IF 102, it is similarly necessary to check a minimum of four combinations.

Figure 8:
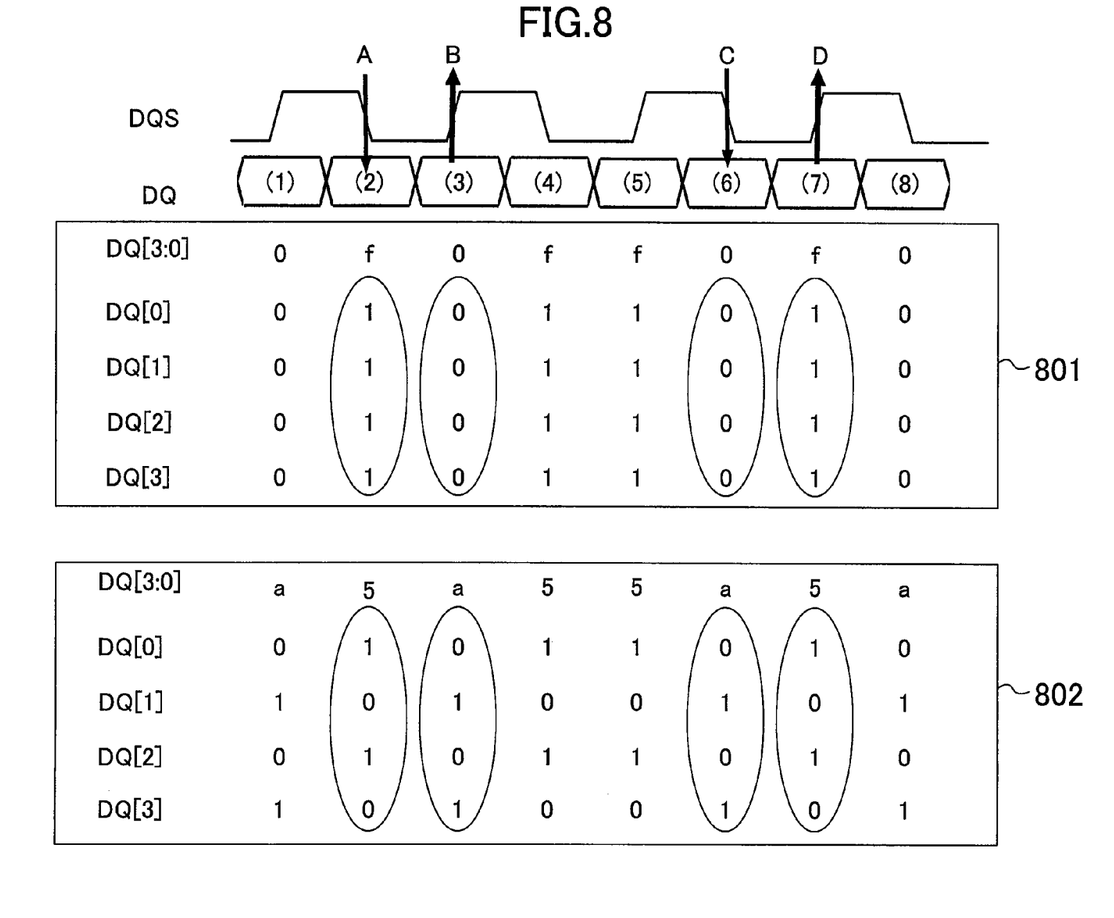
FIG. 8 is a timing diagram showing two examples of timing adjustment data in the memory system of FIGS. 1, 3 and 6.

In FIG. 8, reference symbols A and C indicate check points of data (DQ) information at falls of a strobe (DQS) signal, and reference symbols B and D indicate check points of data information at rises of the strobe signal.

Data information has a width which is smaller than or equal to the half clock period of the strobe signal, and therefore, it is necessary to set different values at the edges of a clock before and after each check point. For the sake of simplicity, data information is assumed to have a width of four bits (DQ[3:0]), and examples of data information are shown as 801 and 802.

In example 801, the data information differs between both edges, which makes it possible to detect a half-clock shift. Moreover, adjacent bits of the data information are set to be the same. The data information, which is represented by DQ[3:0], is transferred in the 8-bit burst mode, and is specifically 0f0ff0f0. Instead of this, the data information may be f0f00f0f.

In example 802, the data information differs between both edges, which makes it possible to detect a half-clock shift. Moreover, adjacent bits of the data information are set to be inverse to each other. The data information, which is represented by DQ[3:0], is transferred in the 8-bit burst mode, and is specifically a5a55a5a. The data information may be 5a5aa5a5 based on a similar idea.

The timing adjustment data which is used to adjust the delay may be other various pieces of data based on a similar idea. Although it has been assumed above that data information has a 4-bit width as an example, data information may have other bit widths. In this case, timing adjustment data can be created based on a similar idea.

Industrial Applicability

As described above, in the memory device, the memory system, and the access timing adjusting method in the memory system of the present invention, the memory device includes a delay adjustment storage unit which stores well-defined data information. A memory interface reads out timing adjustment data stored in the delay adjustment storage unit of the memory device while changing read timing, to search for a timing range within which data can be read out, and quickly, reliably and accurately set optimum timing within the timing range. Therefore, the present invention is useful in higher-speed memory systems.

DESCRIPTION OF REFERENCE CHARACTERS

100 Memory System
102 Memory Interface (Memory IF)
103 Memory Device
140 Memory Device Controller
150 Data Controller
170 Delay Adjustment Storage Unit
171 IO Buffer
172 Selector
173 Latch Unit
174 Memory Cell
200 Data Setting Unit
300 Selector
301 Data Setting Unit
302 Delay Adjustment Storage Unit

The invention claimed is:

1. A memory system comprising:
    a memory device;
    a memory interface configured to access the memory device; and
    a plurality of data signal lines configured to connect the memory device and the memory interface,
    wherein the memory device includes:
        a memory device controller configured to control an inner portion of the memory device based on an access from the memory interface;
        a memory cell configured to store data;
        a delay adjustment storage unit configured to store timing adjustment data which is used to adjust timing of data and a strobe signal; and
        a selector configured to select either a path to or from the delay adjustment storage unit or a path to or from the memory cell, as a path from or to the memory interface.
    the memory interface reads out data 0 at a rise of a strobe signal output from the memory device at a first timing, data 1 at a rise of the strobe signal at a second timing before or after the first timing, data 0 at a fall of the strobe signal at a third timing and data 1 at a fall of the strobe signal at a fourth timing before or after the third timing, as the timing adjustment data, via each of the plurality of data signal lines, and
    the memory interface searches for a timing range within which the data can be read out while changing timing of reading of the timing adjustment data from the delay adjustment storage unit, and selects and sets timing of reading of the data from the timing range.

2. The memory system of claim 1, wherein
    the memory interface writes timing adjustment data into the memory cell while changing the timing and reads out timing adjustment data written in the memory cell to search for a timing range within which the timing adjustment data written in the memory cell matches the timing adjustment data read out from the memory cell, and selects and sets timing of writing of the data from the timing range.

3. The memory system of claim 2, wherein
    when the timing adjustment data is written into the memory cell, data 0is written at a rise of a strobe signal input to the memory device at a fifth timing, data 1 is written at a rise of the strobe signal at a sixth timing before or after the fifth timing, data 0 is written at a fall of the strobe signal at a seventh timing, and data 1 is written at a fall of the strobe signal at an eighth timing before or after the seventh timing, via each of the data signal lines.

4. A memory system comprising:
    a memory device;
    a memory interface configured to access the memory device; and a command signal line and a plurality of data signal lines configured to connect the memory device and the memory interface, wherein the memory device includes:
- a memory device controller configured to control an inner portion of the memory device based on an access from the memory interface;
- a memory cell configured to store data;
- a delay adjustment storage unit configured to store timing adjustment data which is used to adjust timing of data and a strobe signal;
- a data setting unit configured to set the timing adjustment data into the delay adjustment storage unit; and
- a selector configured to select either a path to or from the delay adjustment storage unit or a path to or from the memory cell, as a path from or to the memory interface, the data setting unit sets data transferred as a command from the memory interface via the command signal line, as the timing adjustment data, into the delay adjustment storage unit, the memory interface reads out or writes data 0 at a rise of a strobe signal between the memory interface and the memory device at a first timing, data 1 at a rise of the strobe signal at a second timing before or after the first timing, data 0 at a fall of the strobe signal at a third timing, and data 1 at a fall of the strobe signal at a fourth timing before or after the third timing, as the timing adjustment data, via the memory device and each of the plurality of data signal lines, and the memory interface reads out the timing adjustment data set in the delay adjustment storage unit while changing the timing to search for a timing range within which the data can be read out, and selects and sets timing of reading of the data from the timing range.

5. A memory system comprising:
a memory device;
a memory interface configured to access the memory device; and
a command signal line and a plurality of data signal lines configured to connect the memory device and the memory interface, wherein the memory device includes:
- a memory device controller configured to control an inner portion of the memory device based on an access from the memory interface;
- a memory cell configured to store data;
- a data setting unit configured to set data transferred as a command from the memory interface via the command signal line, as timing adjustment data, into the memory cell; and
- a selector configured to select either a path to or from the data setting unit or a path to or from the memory interface, as a path from or to the memory cell, the memory interface reads out or writes data 0 at a rise of a strobe signal between the memory interface and the memory device at a first timing, data 1 at a rise of the strobe signal at a second timing before or after the first timing, data 0 at a fall of the strobe signal at a third timing, and data 1 at a fall of the strobe signal at a fourth timing before or after the third timing, as the timing adjustment data, via the memory device and each of the plurality of data signal lines, and the memory interface reads out the timing adjustment data set in the memory cell while changing the timing to search for a timing range within which the data can be read out, and selects and sets timing of reading of the data from the timing range.

6. A method for adjusting access timing in a memory system including a memory device and a memory interface connected to the memory device via a plurality of data signal lines, the method comprising steps of:
- causing the memory interface to read out or write data 0 at a rise of a strobe signal between the memory interface and the memory device at a first timing, data 1 at a rise of the strobe signal at a second timing before or after the first timing, data 0 at a fall of the strobe signal at a third timing, and data 1 at a fall of the strobe signal at a fourth timing before or after the third timing, as pieces of timing adjustment data, via each of the plurality of data signal lines; and
- causing the memory interface to search for a timing range within which data can be read out from the memory cell of the memory device while changing timing of reading of at least the four pieces of timing adjustment data, and select and set timing of reading of the data from the timing range.

7. A method for adjusting access timing in a memory system including a memory device and a memory interface connected to the memory device via a command signal line, the method comprising steps of:
- causing a data setting unit in the memory device to set data transferred as a command from the memory interface via the command signal line, as timing adjustment data, into a delay adjustment storage unit in the memory device;
- causing the memory interface to read out or write data 0 at a rise of a strobe signal between the memory interface and the memory device at a first timing, data 1 at a rise of the strobe signal at a second timing before or after the first timing, data 0 at a fall of the strobe signal at a third timing, and data 1 at a fall of the strobe signal at a fourth timing before or after the third timing, as timing adjustment data, via each of a plurality of data signal lines connecting the memory device and the memory interface; and
- causing the memory interface to read out the timing adjustment data set in the delay adjustment storage unit while changing the timing to search for a timing range within which data can be read out from a memory cell of the memory device, and select and set timing of reading of the data from the timing range.

8. A method for adjusting access timing in a memory system including a memory device and a memory interface connected to the memory device via a command signal line, the method comprising the steps of:
- causing a data setting unit in the memory device to set data transferred as a command from the memory interface via the command signal line, as timing adjustment data, into a memory cell of the memory device;
- causing the memory interface to read out or write data 0 at a rise of a strobe signal between the memory interface and the memory device at a first timing, data 1 at a rise of the strobe signal at a second timing before or after the first timing, data 0 at a fall of the strobe signal at a third timing, and data 1 at a fall of the strobe signal at a fourth timing before or after the third timing, as timing adjustment data, via each of a plurality of data signal lines connecting the memory device and the memory interface; and
- causing the memory interface to read out the timing adjustment data set in the memory cell while changing the timing to search for a timing range within which data can be read out from the memory cell, and select and set timing of reading of the data from the timing range.

9. A memory device connected to a memory interface via a plurality of data signal lines, comprising:
a memory cell configured to store data;
a delay adjustment storage unit configured to store, as timing adjustment data to be output via each of the plurality of data signal lines to the memory interface, data 0 at a rise of a strobe signal output from the memory device at a first timing, data 1 at a rise of the strobe signal at a second timing before or after the first timing, data 0 at a fall of the strobe signal at a third timing and data 1 at a fall of the strobe signal at a fourth timing before or after the third timing; and
a selector configured to select either a path to or from the delay adjustment storage unit or a path to or from the memory cell, as a path from or to the memory interface.

10. A memory device connected to a memory interface via a command signal line and a plurality of data signal lines, comprising:
a memory cell configured to store data;
a delay adjustment storage unit configured to store timing adjustment data used to adjust timing of data and a strobe signal;
a data setting unit configured to set the timing adjustment data into the delay adjustment storage unit; and
a selector configured to select either a path to or from the delay adjustment storage unit or a path to or from the memory cell, as a path from or to the memory interface,
wherein the memory interface reads out data 0 at a rise of the strobe signal at a first timing, data 1 at a rise of the strobe signal at a second timing before or after the first timing, data 0 at a fall of the strobe signal at a third timing, and data 1 at a fall of the strobe signal at a fourth timing before or after the third timing, as timing adjustment data, via each of a plurality of data signal line, and
the data setting unit sets data transferred as a command from the memory interface via the command signal line, as timing adjustment data, into the delay adjustment storage unit.

11. A memory device connected to a memory interface via a command signal line and a plurality of data signal lines, comprising:
a memory cell configured to store data;
a data setting unit configured to set data transferred via the command signal line as timing adjustment data, into the memory cell; and
a selector configured to select either a path to or from the data setting unit or a path to or from the memory interface, as a path from or to the memory cell,
wherein the memory interface reads out data 0 at a rise of a strobe signal between the memory interface and the memory device at a first timing, data 1 at a rise of the strobe signal at a second timing before or after the first timing, data 0 at a fall of the strobe signal at a third timing, and data 1 at a fall of the strobe signal at a fourth timing before or after the third timing, as the timing adjustment data, via each of a plurality of data signal lines.

12. The memory system of claim 1, wherein adjacent bits of the timing adjustment data on corresponding ones of the data signal lines are different.

13. The memory system of claim 3, wherein adjacent bits of the timing adjustment data on corresponding ones of the data signal lines are different.

14. The memory system of claim 1, wherein the timing adjustment data on each of the data signal lines at two successive timings at which the strobe signal changes are different.

15. The memory system of claim 4, wherein adjacent bits of the timing adjustment data on corresponding ones of the data signal lines are different.

16. The memory system of claim 4, wherein the memory interface writes the timing adjustment data into the memory cell while changing the timing, reads out the timing adjustment data written into the memory cell, searches for a timing range within which the timing adjustment data written into the memory cell matches the timing adjustment data read out from the memory cell, and selects and sets timing of writing of the data from the timing range.

17. The memory system of claim 4, wherein the timing adjustment data on each of the data signal lines at two successive timings at which the strobe signal changes are different.

18. The memory system of claim 5, wherein adjacent bits of the timing adjustment data on corresponding ones of the data signal lines are different.

19. The memory system of claim 5, wherein the memory interface writes the timing adjustment data into the memory cell while changing the timing, reads out the timing adjustment data written into the memory cell, searches for a timing range within which the timing adjustment data written into the memory cell matches the timing adjustment data read out from the memory cell, and selects and sets timing of writing of the data from the timing range.

20. The memory system of claim 5, wherein the timing adjustment data on each of the data signal lines at two successive timings at which the strobe signal changes are different.

21. The method of claim 6, wherein adjacent bits of the timing adjustment data on corresponding ones of the data signal lines are different.

22. The method of claim 6, further comprising a step of adjusting timing of writing of data into the memory device using the memory cell.

23. The method of claim 6, further comprising steps of:
causing the memory interface to write data 0 at a rise of the strobe signal output from the memory device at a fifth timing, data 1 at a rise of the strobe signal at a sixth timing before or after the fifth timing, data 0 at a fall of the strobe signal at a seventh timing, and data 1 at a fall of the strobe signal at an eighth timing before or after the seventh timing, as the timing adjustment data, via each of the plurality of data signal lines; and
causing the memory interface to search for a timing range within which data can be written into the memory cell of the memory device while changing timing of writing of the timing adjustment data, and select and set timing of writing of the data from the timing range.

24. The method of claim 6, wherein the timing adjustment data on each of the data signal lines at two successive times at which the strobe signal changes are different.

25. The method of claim 7, wherein adjacent bits of the timing adjustment data on corresponding ones of the data signal lines are different.

26. The method of claim 7, wherein the memory interface writes the timing adjustment data into the memory cell while changing the timing, reads out the timing adjustment data written into the memory cell, searches for a timing range within which the timing adjustment data written into the memory cell matches the timing adjustment data read out from the memory cell, and selects and sets timing of writing of the data from the timing range.

27. The method of claim 7, wherein the timing adjustment data on each of the data signal lines at two successive timings at which the strobe signal changes are different.

28. The method of claim 8, wherein adjacent bits of the timing adjustment data on corresponding ones of the data signal lines are different.

29. The method of claim 8, wherein the memory interface writes the timing adjustment data into the memory cell while changing the timing, reads out the timing adjustment data written into the memory cell, searches for a timing range within which the timing adjustment data written into the memory cell matches the timing adjustment data read out from the memory cell, and selects and sets timing of writing of the data from the timing range.

30. The method of claim 8, wherein the timing adjustment data on each of the data signal lines at two successive timings at which the strobe signal changes are different.

31. The memory device of claim 9, wherein adjacent bits of the timing adjustment data on corresponding ones of the data signal lines are different.

32. The memory device of claim 9, wherein the timing adjustment data on each of the data signal lines at two successive timings at which the strobe signal changes are different.

33. The memory device of claim 10, wherein adjacent bits of the timing adjustment data on corresponding ones of the data signal lines are different.

34. The memory device of claim 10, wherein the memory interface writes data 0 at a rise of the strobe signal at a fifth timing, data 1 at a rise of the strobe signal at a sixth timing before or after the fifth timing, data 0 at a fall of the strobe signal at a seventh timing, and data 1 at a fall of the strobe signal at an eighth timing before or after the seventh timing, as the timing adjustment data, via each of the plurality of data signal lines.

35. The memory device of claim 10, wherein the timing adjustment data on each of the data signal lines at two successive timings at which the strobe signal changes are different.

36. The memory device of claim 11, wherein adjacent bits of the timing adjustment data on corresponding ones of the data signal lines are different.

37. The memory device of claim 11, wherein the memory interface writes data 0 at a rise of the strobe signal at a fifth timing, data 1 at a rise of the strobe signal at a sixth timing before or after the fifth timing, data 0 at a fall of the strobe signal at a seventh timing, and data 1 at a fall of the strobe signal at an eighth timing before or after the seventh timing, as the timing adjustment data, via each of the plurality of data signal lines.

38. The memory device of claim 11, wherein the timing adjustment data on each of the data signal lines at two successive timings at which the strobe signal changes are different.

* * * * *